(12) United States Patent
Beer

(10) Patent No.: US 6,740,917 B2
(45) Date of Patent: May 25, 2004

(54) INTEGRATED SEMICONDUCTOR MEMORY FABRICATION METHOD

(75) Inventor: Peter Beer, Tutzing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/195,194

(22) Filed: Jul. 15, 2002

(65) Prior Publication Data

US 2003/0011010 A1 Jan. 16, 2003

(30) Foreign Application Priority Data

Jul. 13, 2001 (DE) .......................... 101 34 101

(51) Int. Cl.$^7$ ............................................ H01L 27/108
(52) U.S. Cl. .................................................. 257/296
(58) Field of Search ........................... 257/296, 301, 257/302

(56) References Cited

U.S. PATENT DOCUMENTS 5,383,149 A * 1/1995 Hong ........................ 365/104
5,525,820 A * 6/1996 Furuyama .................. 257/296
6,420,228 B1 * 7/2002 Roesner et al. ............. 438/244

FOREIGN PATENT DOCUMENTS

| DE | 195 40 235 A1 | 4/1998 |
| DE | 100 15 278 A1 | 10/2001 |
| JP | 02 106 958 A | 4/1990 |

* cited by examiner

Primary Examiner—Huan Hoang
Assistant Examiner—Quoc Hoang
(74) Attorney, Agent, or Firm—Laurence A. Greenberg; Werner H. Stemer; Ralph E. Locher

(57) ABSTRACT

In integrated semiconductor memories, the area taken up by a memory cell on a semiconductor substrate is always kept as small as possible to be able to accommodate as many memory cells as possible on the area of the substrate. According to the invention, word or bit lines are disposed as line pairs including two lines running one vertically above the other. As a result, two memory cells can be contact-connected in different substrate depths in a confined space. In each case different memory cells are connected to the upper line of a line pair than to the lower bit line of the same line pair. Semiconductor memories so formed require less substrate area per memory cell.

10 Claims, 3 Drawing Sheets

INTEGRATED SEMICONDUCTOR MEMORY FABRICATION METHOD

BACKGROUND OF THE INVENTION

Field of the Invention

The invention relates to an integrated semiconductor memory having a multiplicity of memory cells, which, in a first direction parallel to the surface of a semiconductor substrate, are connected in rows to word lines and, in a second direction parallel to the surface of the semiconductor substrate, are connected in rows to bit lines. The invention furthermore relates to a method for fabricating an integrated semiconductor memory.

Integrated semiconductor memories have a memory cell array in which memory cells are disposed in the form of a matrix on the surface of a semiconductor substrate. Each memory cell has at least one transistor by which the respective memory cell can be driven by mutually crossing lines by which the memory state of the memory cell can be read or altered.

Word lines and bit lines are provided for the electrical driving of the selection transistors. In the case of a MOSFET (metal oxide semiconductor field-effect transistor) as the selection transistor, the gate of the transistor is connected to the word line and the source is connected to the bit line. Word lines and bit lines run parallel to the plane surface of the semiconductor substrate and perpendicularly to one another, i.e., they mutually cross one another. The selection transistors of the memory cells are situated at the crossover points of the lines.

In every semiconductor memory, attempts are made to keep the area taken up by an individual memory cell on the semiconductor substrate as small as possible to allow storage of as much information as possible on the substrate area. The area requirement of a memory cell is prescribed firstly by the complexity of the individual memory cell. A memory cell contains at least one selection transistor and a storage capacitor.

The area requirement is furthermore prescribed by the structure width with which microelectronic structures are produced by lithographic exposure processes on the substrate. The structure width is the minimum width of a microelectronic structure, i.e., a trench or a web, which can be reliably fabricated with a prescribed fabrication technology. Because microelectronic structures are formed using lithographically fabricated masks, the area requirement of a memory cell can be specified in numbers of squares with an edge length that corresponds to the structure width. The minimum area of a structure element is, thus, a square having the size of 1 $f^2$ (f represents the structure width in this case).

Finally, the area requirement is determined by the complexity and the construction of the memory cell itself. The area requirement can be optimized through the type of configuration of the selection transistor, of the storage capacitor, and, if appropriate, of further transistors or other constituent parts of the memory cell.

Today's memory cells require at least an area of 8 $f^2$ on a semiconductor substrate. Such an area is necessary even in the case of a transistor that has only one selection transistor and a storage capacitor because it is necessary to comply with a certain minimum distance from adjacent memory cells, the minimum distance likewise corresponding to the structure width.

SUMMARY OF THE INVENTION

It is accordingly an object of the invention to provide an integrated semiconductor memory and fabrication method that overcomes the hereinafore-mentioned disadvantages of the heretofore-known devices and methods of this general type and that further reduces the area requirement of a memory cell.

With the foregoing and other objects in view, there is provided, in accordance with the invention, an integrated semiconductor memory, including a semiconductor substrate having a surface, bit lines, word lines, memory cells connected, in a first direction parallel to the surface of the semiconductor substrate, in rows to the word lines and connected, in a second direction parallel to the surface, in rows to the bit lines, two of respective one of word lines and bit lines being disposed as line pairs, each of the line pairs having a buried line running in the semiconductor substrate and an upper line disposed above the buried line, and the upper line of a given line pair connected to one of the memory cells and the lower bit line of the given line pair being connected to another different one of the memory cells.

With the objects of the invention in view, there is also provided an integrated semiconductor memory, including a semiconductor substrate having a surface, bit lines, respective pairs of the bit lines being disposed as bit line pairs, word lines, respective pairs of the word lines being disposed as word line pairs, memory cells connected, in a first direction parallel to the surface of the semiconductor substrate, in rows to the word lines and connected, in a second direction parallel to the surface, in rows to the bit lines, at least one of the word line pairs and the bit line pairs having a buried line running in the semiconductor substrate and an upper line disposed above the buried line, the upper line being connected to one of the memory cells, and the buried line being connected to another different one of the memory cells.

The integrated semiconductor memory by virtue of the fact that in each case two word lines or in each case two bit lines are formed as line pairs including two lines disposed one above the other, each line pair having a buried line running in the semiconductor substrate and an upper line disposed above the buried line and in that in each case different memory cells are connected to the upper line of a line pair then to the lower bit line of the same line pair.

According to the invention, the leads for the selection transistors for the memory cells are not only disposed along the surface of the semiconductor substrate in the form of a matrix, but layering into the substrate is additionally effected in the case of at least one type of leads—the word lines or the bit lines. In such a case, these layered lines are disposed in the form of line pairs in the substrate, the lower line of which runs in a manner buried in the substrate and is insulated from the overlying line by an insulating layer. The two lines of a line pair are disposed one above the other, i.e., one vertically above the other, for example, in a common trench one above the other or in the same region of the base area of the semiconductor substrate.

As a result, the memory cells can be disposed, at least in one direction, with up to double the memory cell density on the semiconductor substrate. Along the paired lines, the memory cells are alternately connected to the upper line and the buried line, thereby enabling all the memory cells to be contact-connected. The contact connection can also be effected on different sides of the interconnects, for example, toward the right proceeding from the buried lines and toward the left proceeding from the upper lines. The present invention's configuration of the lines to form line pairs with lines lying one above the other in the depth enables new configurations and construction of memory cells.

In accordance with another feature of the invention, the bit lines are disposed as buried line pairs and the word lines are disposed laterally next to one another. Such a configuration is advantageous if vertical transistors have to be connected to the bit lines. In such a case, source and drain are situated one above the other so that one of the electrodes can be connected to the buried bit line and the other to the upper bit line. Particularly when the source connections of adjacent selection transistors are disposed alternately above and below the gate connection, the bit line pair according to the invention enables contact connection in two different substrate depths.

Preferably, the word lines cross the line pairs of the bit lines in a middle substrate depth between the two bit lines of a line pair. In such an embodiment, the word lines can still be disposed very near the surface in the semiconductor substrate. A bit line, a word line, and a further bit line of the same bit line pair are disposed one after the other from top to bottom at the point of intersection between the trenches for the bit lines and the word lines.

Two alternative embodiments provide for the upper bit lines to run above the monocrystalline crystal lattice of the semiconductor substrate or to be buried above the buried big lines. Accordingly, an upper bit line can be applied or introduced above or into the trench in which the buried bit line is already disposed. Burying the upper bit line, too, has the advantage that the etching-back can be effected without an additional mask because the trench is already patterned.

In accordance with a further feature of the invention, the memory cells are disposed in cell pairs whose first memory cells are connected to upper bit lines and whose second memory cells are connected to lower bit lines. Combining in each case two memory cells can further reduce the area requirement of the memory cells because the memory cells can be alternately connected to the upper and to the lower bit line. Such a contact connection saves a great deal of space.

Preferably, selection transistors respectively of a first and a second memory cell of a cell pair are formed as vertical transistors whose word lines are disposed in a common trench. By virtue of the configuration of two gate contacts of a memory cell pair in a common trench, the gate contacts are at a distance of less than one structure width from one another. By contrast, if they are disposed in different trenches that each have a width of one structure width and are separated from one another by an additional distance of at least likewise one structure width, the area requirement of the memory cells is significantly larger.

Preferably, a deep trench capacitor connected to the transistor of the first memory cell is disposed below the selection transistors of the first and the second memory cell of a cell pair and a capacitor connected to the transistor of the second memory cell is disposed on the semiconductor substrate, in a stacked construction.

In such a case, the selection transistors are alternately connected to storage capacitors in the substrate and storage capacitors on the substrate so that the storage capacitors disposed at two different levels can be disposed with greater density. In such a case, it is possible to have recourse to prior art technologies for fabricating deep trench capacitors that are buried in the substrate and extend far into the depth, and for capacitors of stacked configuration that are formed on the substrate surface.

In accordance with an added feature of the invention, the common trench for the word lines of the first and the second memory cell of a cell pair is preferably disposed above the deep trench capacitor. Because a channel leading into the depth perpendicularly to the substrate surface is already formed for the buried capacitor, the vertical transistors can be disposed in pairs in the upper region of the channel. Their word lines run in pairs in a direction across a multiplicity of capacitors (deep trenches).

Finally, the integrated semiconductor memory can be a DRAM (dynamic random access memory) memory. Memory modules such as DRAMs are those modules that benefit most from space saving because the requirements made of the switching behavior of the memory transistors are less stringent in comparison with logic transistors with partly analog switching functions and memory cells have to be optimized exclusively with regard to reliable charge storage and a small area requirement.

With the objects of the invention in view, there is also provided a method for fabricating an integrated semiconductor memory, including the steps of (a) etching a first trench for word or bit lines into the surface of a semiconductor substrate, (b) forming an electrical insulation layer on the uncovered inner area of the trench, (c) forming a lower electrical line running at the bottom of the trench, (d) filling the trench above the lower line at least up to a part of the as yet unfilled trench depth with an insulating material, and (e) forming an upper electrical line above the lower line on or in the trench.

According to the invention, the trench is filled not with a single line but with two lines that lay one above the other and are insulated from one another in different substrate depths. As a result, it is possible to connect vertical transistors, below the substrate surface, both to their upper and to their lower source and drain contacts, for instance, if the source contacts lie alternately at the top and bottom. The electrical insulation layer electrically insulates the lower line toward the bottom and toward the side and the upper line toward the side.

In accordance with an additional mode of the invention, at the trench, with the aid of a mask, a short connection trench joining the first trench is etched at least as far as a substrate depth, in which the lower line runs, and is filled with a connection contact in the depth. Thus, a bit line buried at the bottom of the trench can be laterally contact-connected if the trench cannot be fabricated at the same time as joining transverse trenches. The connection contacts that are to be introduced into connection trenches can adjoin already doped regions of the selection transistors and, thus, produce the contact between the selection transistor and the buried line.

In accordance with yet another mode of the invention, the connection trench is filled in an insulating manner at least up to a part of the as yet unfilled trench depth above the lower line. Accordingly, the upper line can be introduced into the as yet open region of the trench and, in a similar manner to the lower line, be connected to doped regions of transistors or other electronic devices.

In accordance with a concomitant mode of the invention, after step b), but before step e), a second trench is etched that crosses the first trench in the semiconductor substrate, and two further lines are introduced into the second trench in a substrate depth, which is smaller than the depth of the lower line. The lines running in the second trench are preferably word lines, whereas bit lines run in the first trench. The word lines may likewise be disposed in pairs in the second trench, in which case they are disposed either in the same way as the bit lines at a different depth one above the other or at the same substrate depth next to one another and separated by an insulator. In the latter case, they are led through between the upper and lower bit lines at the crossover point between the first and second trenches. If the word lines are also disposed one above the other, the lower word line can also run below the lower bit line. In such a case, the trench for the word lines must be etched first and the lower word line completed before the trench for the bit line and the lower bit line are produced. Finally, firstly the upper word line and then the upper bit line are produced.

Other features that are considered as characteristic for the invention are set forth in the appended claims.

Although the invention is illustrated and described herein as embodied in an integrated semiconductor memory and fabrication method, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1A:
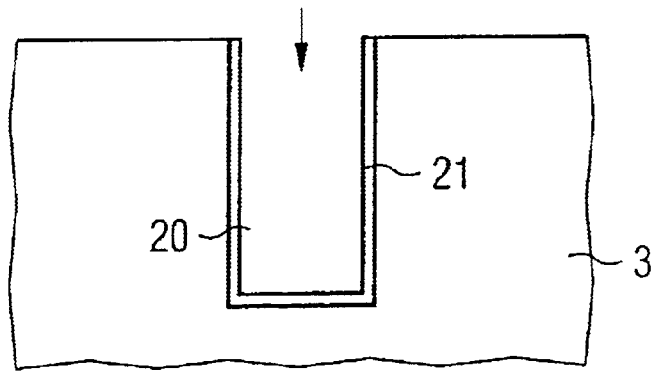
FIGS. 1A to 1E are fragmentary, cross-sectional views of a detail of an integrated semiconductor circuit in different stages of the method according to the invention.
Figure 1B:
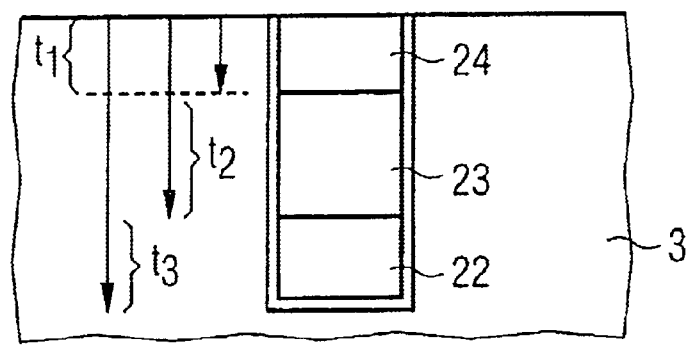

Referring now to the figures of the drawings in detail and first, particularly to FIG. 1A thereof, there is shown a cross section of a detail from a monocrystalline semiconductor substrate 3, into which a trench 20 is etched. After the trench was etched, an electrically insulating layer 21 was formed at the uncovered inner wall of the trench, for example, by oxidation or deposition. The trench is firstly filled with a lower conductive layer 22 above the bottom of the trench. For such a purpose, a metal such as tungsten, for example, is deposited over the entire trench height and then etched back to the height of the layer 22. In the same way, the trench is subsequently filled with an insulating material 23 and a conductive material 24. As a result, two lines 22, 24 that run one above the other and are electrically insulated from one another are produced in the trench 20.

Figure 1C:
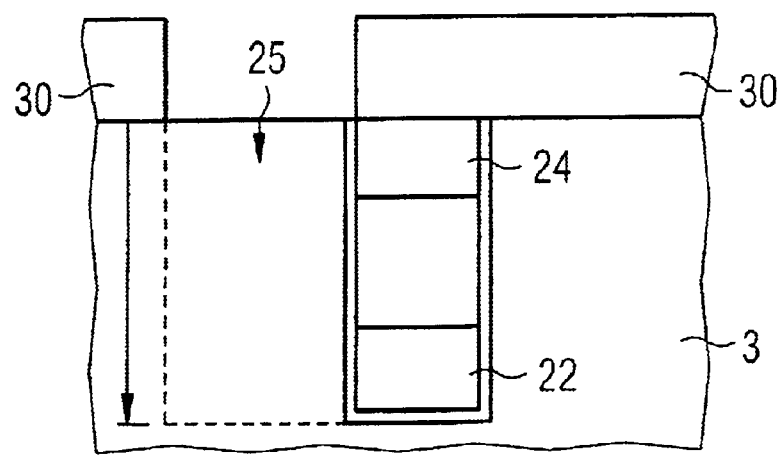

The space requirement of memory cells 8, 9 of an integrated semiconductor memory 1 is reduced with the aid of such buried lines 22, 24 lying one above the other as word or bit lines 5, 6. To that end, the lines 5, 6 are connected to selection transistors of the memory cells 8, 9. For such a purpose, as illustrated in FIG. 1C, the semiconductor substrate 3 is covered with a mask 30 that, laterally adjoining the trench 20, has a mask opening for the uncovering of a short connection trench 25. The connection trench is etched down to that depth t3 in which the lower line, for example, a bit line 22, is situated in the trench 20.

Figure 1D:
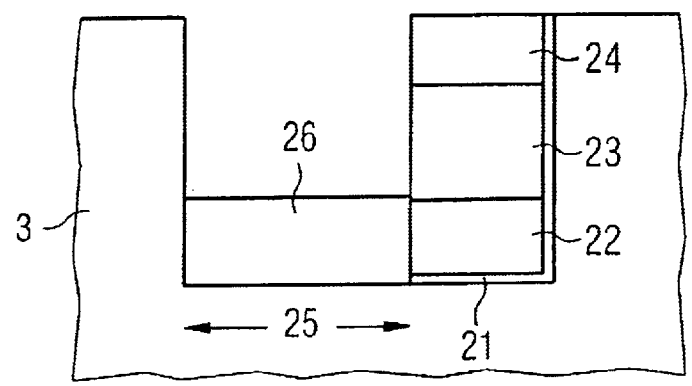

The structure fabricated after the etching of the connection trench 25 with the aid of the resist mask 30 is illustrated in cross section in FIG. 1D. In the plane of the drawing, the short connection trench 25 leads into the first trench 20. A contact filling 26 has already been introduced into the connection trench, which contact filling serves for contact-connecting a transistor connection buried in the substrate. The connection trench still has an open region above the contact connection 26, which region must be filled to prevent short circuits from arising between the lower line 22 or the contact connection 26 and the upper line 24. To that end, the trench 25 is filled above the filling 26 with an insulating material 27 up to the substrate surface.

Figure 1E:
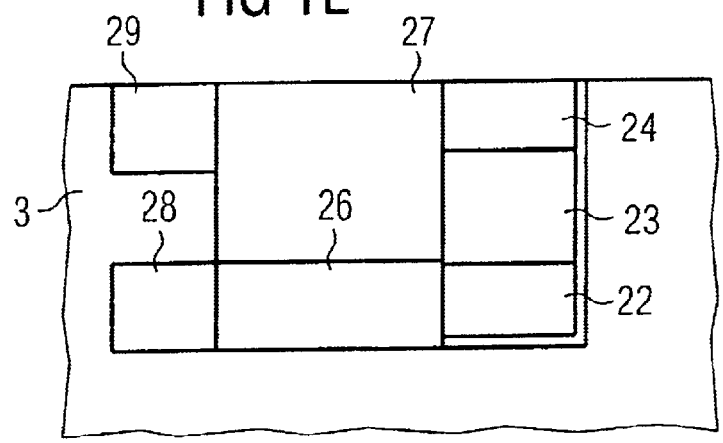

FIG. 1E shows, in addition to the trench configuration from FIG. 1D, two doped regions, a source electrode 28, and a drain electrode 29 of a vertical transistor whose gate is situated below the plane of the drawing between the electrodes 28 and 29. The source electrode 28 is electrically connected to the line 22 by the contact connection 26, whereas the line 24 is not electrically connected to the drain electrode 29.

FIGS. 1A to 1E are illustrated in cross-section, the cross-section lying at one and the same location in the trench 20 in all of the figures. In the direction perpendicular to the plane of the drawing, cross-sections like in FIG. 1E recur in an alternating sequence with those non-illustrated sections in which, rather than the lower line 22, the upper line 24 is connected to drain electrodes 29 disposed at the same level. In these sections, analogously to FIG. 1E, the corresponding connection trench 25 is filled up to the level of the underside of the upper line 24 and is filled above that with a corresponding connection contact.

As such, the interconnects 22, 24 are formed in a single trench 20, through the lines of which interconnects selection transistors disposed in a row parallel to the trench 20 are alternately connected to their upper and lower electrodes 29, 28.

Figure 2A:
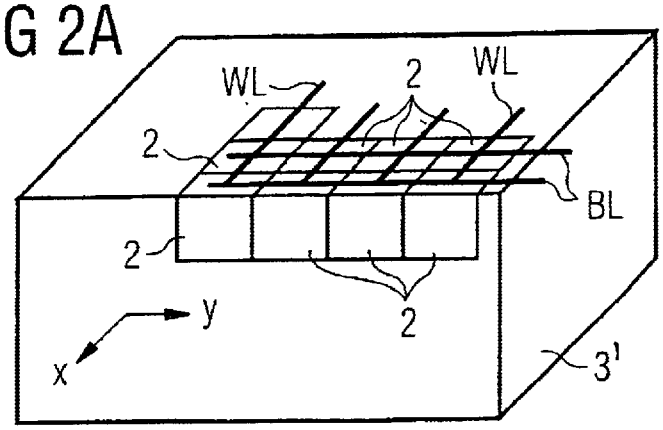
FIG. 2A is a fragmentary, perspective view of an integrated semiconductor memory according to the invention.

FIG. 2A shows an integrated semiconductor memory 3' having memory cells 2 disposed on the surface of a substrate in a first direction x in rows with word lines WL and, in a second direction y, which runs perpendicularly to the first direction are connected in rows to bit lines BL.

A single memory cell 2 can be accessed by driving a respective bit line BL and word line WL.

Figure 2B:
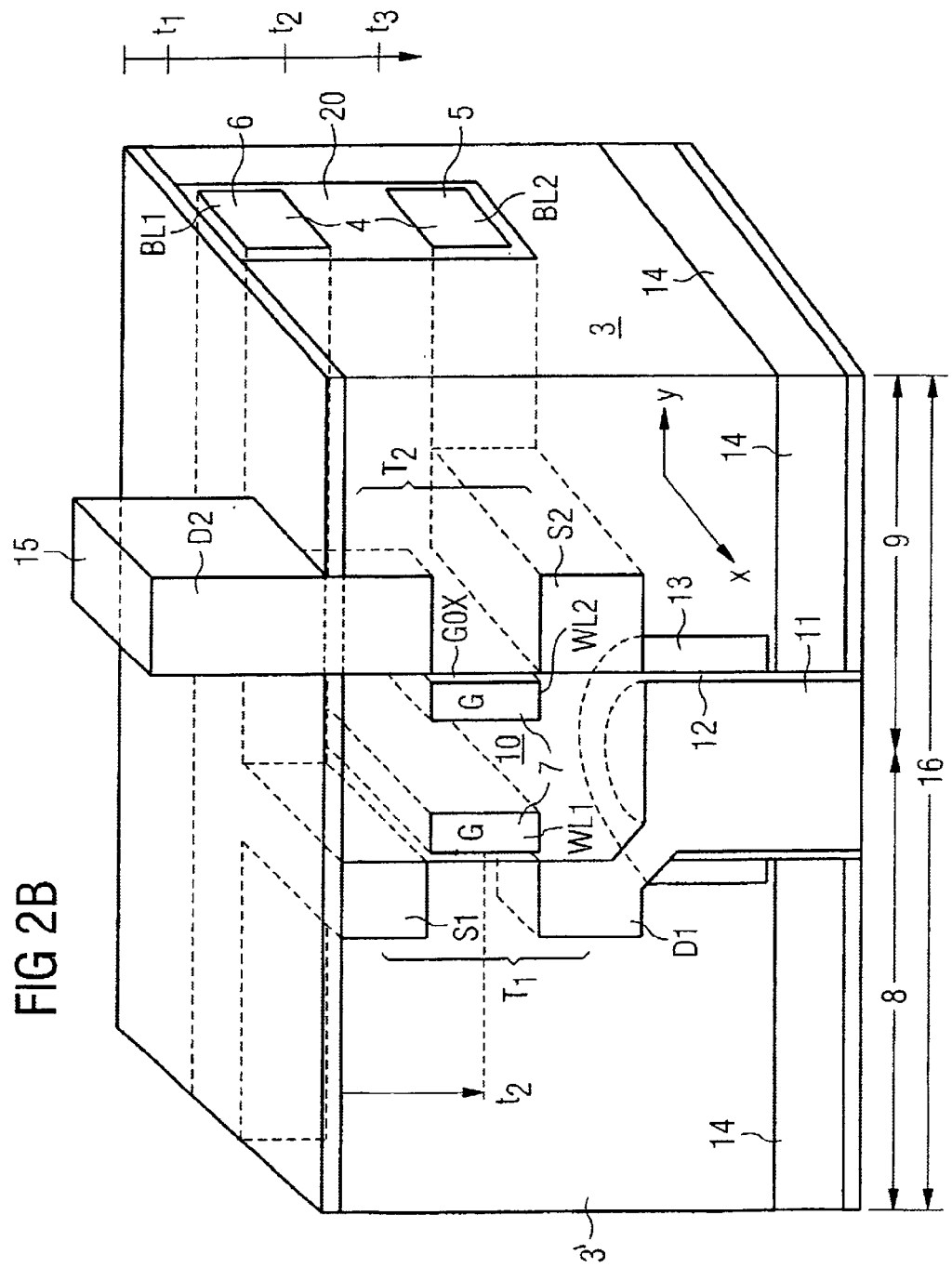
FIG. 2B is a fragmentary, perspective view of an embodiment of a semiconductor memory according to the invention.

FIG. 2B shows an embodiment of a semiconductor memory according to the invention. The detail illustrated corresponds to a cell from FIG. 2A. In the semiconductor memory according to the invention, in each case two bit lines 5, 6 are disposed as a line pair 4, of which only one pair 4 is illustrated, each line pair 4 having a buried line 5 running in the semiconductor substrate 3 and an upper line 6 disposed above the buried line 5. The bit lines 5, 6 that are stacked into the substrate depth according to the invention enable a denser configuration of memory cells than is conventionally achieved. The cells of the semiconductor memory in FIG. 2B are disposed in cell pairs 16 respectively including a first memory cell 8 and a second memory cell 9, the selection transistor T1 being connected through its source electrode S1 to the upper bit line 6 and the transistor T2 of the second memory cell 9 being connected through the source electrode S2 to the lower bit line 5. By virtue of the configuration with source electrodes connected to the bit lines alternately at the top and bottom, two memory cells can be contact-connected in a confined space.

The selection transistors T1, T2 are preferably disposed as vertical transistors at the sidewalls of one and the same trench 10. An electrical connection leads from the drain connection D1 of the first transistor T1 to a deep trench capacitor 11 that is fabricated with the aid of conventional methods and extends very deeply into the substrate. It has an inner capacitor filling 11 is disposed within an insulation 12 and is insulated by a reinforced insulation 13 in the direction of the transistors T1, T2, and is connected to a specific electrical potential by a buried contact layer 14, which simultaneously constitutes the second electrode of the capacitor. Such potential is identical for all of the buried capacitors 11.

By switching the word line 7 connected to the gate G and the upper bit line BL1 6, the transistor T1 can be switched and the charge on the buried capacitor 11 can be reversed.

The second transistor T2 of the second memory cell 9, which transistor is disposed in the same trench 10 as the first transistor T1, is not electrically connected to the buried capacitor 11. Instead, it is connected through its drain electrode D2 disposed at the top to a capacitor 115, which is produced in a conventional stacked configuration. Fabrication methods for such capacitors 15 that are stacked on the substrate surface and typically include stacks of many layers are in the prior art.

Through the combination of storage capacitors 11, 15 that are buried and that are produced on the substrate surface, the area requirement of an individual memory cell 16 can be reduced even further. Through the combined configuration of adjacent memory cells 8, 9 with a respective storage capacitor 11 directed into the depth and a respective capacitor 15 located above the monocrystalline substrate material 3, in a stacked configuration, the bit lines 5 and 6 running in different substrate depths t1, t3 can be alternately connected, in the y direction, in both substrate depths. Such a configuration makes it possible to contact-connect the selection transistors of two memory cells 8, 9 whose gate connections are likewise disposed in a further, common trench. The pairwise configuration of in each case two structures in a trench obviates the otherwise lithographically governed distance between adjacent memory cells, on account of which the area requirement of a single memory cell is typically at least 8 $f^2$, where $f^2$ is an area square of the dimension of a structure width. By contrast, the integrated semiconductor memory according to the invention has memory cell pairs 16 whose individual memory cells 8, 9 in each case require only a space of about 4 $f^2$. The bit lines 5 and 6 running in different substrate depths t1, t3 one below the other make it possible to combine in each case two memory cells to form pairs such as, for instance, the one illustrated in FIG. 2B.

The word lines WL1, WL2 that cross the bit lines and are required for contact-connecting the gate connections 7, which run in pairs in one and the same trench 10, are led through the crossover point between the trenches of word lines and bit lines in a middle substrate depth t2, lying between the substrate depths t1, t3 of the upper and lower bit lines 6, 5. As a result, the word lines 7 can still be laid in a very small substrate depth.

I claim:

1. An integrated semiconductor memory, comprising:
   a semiconductor substrate having a surface and trenches together forming a common trench;
   bit lines;
   word lines;
   memory cells connected, in a first direction parallel to said surface of said semiconductor substrate, in rows to said word lines and connected, in a second direction parallel to said surface, in rows to said bit lines, said memory cells each having a selection transistor and defining memory cell pairs each having two of said memory cells, said selection transistors of said memory cell pairs being vertical transistors having respective ones of said word lines disposed in said common trench of said trenches;
   a respective two of said bit lines being disposed as line pairs;
   each of said line pairs having:
      a buried line running in said semiconductor substrate; and
      an upper line disposed above said buried line; and
   said upper line of a given line pair connected to one of said memory cells and a lower bit line of said given line pair being connected to another different one of said memory cells.

2. The semiconductor memory according to claim 1, wherein:
   said bit lines are disposed as buried line pairs; and
   said word lines are disposed laterally next to one another.

3. The semiconductor memory according to claim 2, wherein:
   said semiconductor substrate has a middle substrate depth; and
   said word lines cross said line pairs of said bit lines in said middle substrate depth between two of said bit lines of a given one of said line pairs.

4. The semiconductor memory according to claim 1, wherein:
   said semiconductor substrate has a monocrystalline crystal lattice; and
   said upper line runs above said monocrystalline crystal lattice.

5. The semiconductor memory according to claim 1, wherein said upper line is buried above said buried line.

6. The semiconductor memory according to claim 1, wherein said upper line is buried in said semiconductor substrate above said buried line.

7. The semiconductor memory according to claim 1, wherein:
   said bit lines are disposed as bit line pairs; and
   one of two adjacent ones of said memory cells is connected to said upper line of a given bit line pair and another of said two adjacent ones of said memory cells is connected to said buried line of said given bit line pair.

8. The semiconductor memory according to claim 1, wherein:
   said memory cell pairs have a first memory cell and a second memory cell;
   a deep trench capacitor is connected to said selection transistor of said first memory cell;
   a capacitor is connected to said selection transistor of said second memory cell; and
   said deep trench capacitor and said capacitor are in a stacked configuration, said deep trench capacitor being disposed below said selection transistors of said memory cell pair and said capacitor being disposed on said semiconductor substrate.

9. The semiconductor memory according to claim 1, wherein said common trench for respective ones of said word lines of said first and second memory cells of each of said memory cell pairs is disposed above said deep trench capacitor.

10. The semiconductor memory according to claim 1, wherein the semiconductor memory is a DRAM memory.

* * * * *